(12) United States Patent
Mueller-Mach et al.

(10) Patent No.: US 7,183,577 B2
(45) Date of Patent: *Feb. 27, 2007

(54) THIN FILM PHOSPHOR-CONVERTED LIGHT EMITTING DIODE DEVICE

(75) Inventors: Regina B. Mueller-Mach, San Jose, CA (US); Gerd O. Mueller, San Jose, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 320 days.

This patent is subject to a terminal disclaimer.

(21) Appl. No.: 10/785,745

(22) Filed: Feb. 23, 2004

(65) Prior Publication Data

US 2004/0164307 A1    Aug. 26, 2004

Related U.S. Application Data

(63) Continuation of application No. 09/405,938, filed on Sep. 27, 1999, now Pat. No. 6,696,703.

(51) Int. Cl.
*H01L 27/15*     (2006.01)

(52) U.S. Cl. ............................ 257/79; 257/81; 257/98; 257/102

(58) Field of Classification Search ........... 257/79–103
See application file for complete search history.

(56) References Cited

U.S. PATENT DOCUMENTS

| | | | |
|---|---|---|---|
| 6,313,181 B1 * | 11/2001 | Cohen | 424/59 |
| 6,384,529 B2 * | 5/2002 | Tang et al. | 313/506 |
| 6,517,213 B1 * | 2/2003 | Fujita et al. | 362/84 |
| 6,576,930 B2 | 6/2003 | Reeh et al. | |
| 6,696,703 B2 * | 2/2004 | Mueller-Mach et al. | 257/98 |

* cited by examiner

*Primary Examiner*—Wai-Sing Louie
(74) *Attorney, Agent, or Firm*—Patent Law Group LLP

(57) ABSTRACT

A light emitting diode capable of emitting first light having a first peak wavelength is combined with a first phosphor layer overlying the light emitting diode, the first phosphor layer capable of absorbing the first light and emitting second light having a second peak wavelength and a second phosphor layer overlying the light emitting diode, the second phosphor layer capable of emitting third light having a third peak wavelength.

15 Claims, 3 Drawing Sheets

WHITE LIGHT

WHITE LIGHT

THIN FILM PHOSPHOR-CONVERTED LIGHT EMITTING DIODE DEVICE

CROSS REFERENCE TO RELATED APPLICATIONS

This application is a continuation of U.S. application Ser. No. 09/405,938, filed Sep. 27, 1999, now U.S. Pat. No. 6,696,703, granted Feb. 24, 2004 and incorporated herein by reference.

BACKGROUND

1. Field of Invention

The present invention relates to light emitting diodes (LEDs) and, more particularly, to a phosphor-converted LED device that utilizes one or more phosphor thin films for converting primary light emitted by the LED into one or more other frequencies of light in order to generate white light.

2. Description of Related Art

With the development of efficient LEDs that emit blue or ultraviolet (UV) light, it has become feasible to produce LEDs that generate white light through phosphor conversion of a portion of the primary emission of the LED to longer wavelengths. Conversion of primary emission of the LED to longer wavelengths is commonly referred to as down-conversion of the primary emission. An unconverted portion of the primary emission combines with the light of longer wavelength to produce white light. LEDs that produce white light are useful for signaling and/or illumination purposes.

Currently, state-of-the-art phosphor conversion of a portion of the primary emission of the LED is attained by placing a phosphor in an epoxy that is used to fill the reflector cup, which houses the LED within the LED lamp. The phosphor is in the form of a powder that is mixed into the epoxy prior to curing the epoxy. The uncured epoxy slurry containing the phosphor powder is then deposited onto the LED and is subsequently cured.

The phosphor particles within the cured epoxy generally are randomly oriented and interspersed throughout the epoxy. A portion of the primary light emitted by the LED passes through the epoxy without impinging on the phosphor particles, whereas a portion of the primary light emitted by the LED impinges on the phosphor particles, thereby causing the phosphor particles to emit complimentary light. The combination of the primary blue light and the phosphor-emitted light produces white light. One disadvantage of utilizing the epoxy comprising the phosphor particles is that uniformity in the white light emitted by the LED is difficult, if not impossible, to obtain. This non-uniformity is caused by non-uniformity in the sizes of the phosphor particles mixed into the epoxy slurry. Currently, phosphor powders having uniform phosphor particle sizes generally are not available. When the phosphor powder is mixed into the epoxy slurry, the larger phosphor particles sink faster than the smaller phosphor particles. This non-uniformity in spatial distribution of the phosphor particles exists in the epoxy once it has been cured.

Therefore, obtaining a uniform distribution of the phosphor particles within the epoxy is very difficult, if not impossible, due to the non-uniformity of the sizes of the phosphor particles. This inability to control the sizes of the phosphor particles and their locations within the epoxy results in difficulties in producing LED lamps that emit white light in a consistent manner. Therefore, the quality of the white light produced by LED lamps may vary from one lamp to another, even for a given model manufactured by a particular manufacturer.

Attempts have been made to overcome the disadvantages of using phosphor powders mixed with epoxies by placing luminescent organic dye films on a lens that encases the LED. The dye is carefully positioned on the lens at a particular location so that it totally absorbs all of the primary light impinging thereon and converts the primary light to light of a longer wavelength. A fraction of the primary light emitted passes through the lens without impinging on the dye. The primary light that does not impinge on the dye then combines with the longer-wavelength light to produce white light. Since the dye totally absorbs the primary light impinging thereon, any variation in the fraction of the primary light that is summed with the longer-wavelength light is supposed to be eliminated.

However, this latter approach also has several disadvantages. The placement of the dye on the lens is subject to manufacturing uncertainties, which may result in variations in the white light produced. Also, dyes that are stable over long periods of time generally are not available. As a result, wide spread use of wavelength-converting dyes has not occurred.

Accordingly, a need exists for a phosphor-converted LED that overcomes these problems and disadvantages.

SUMMARY

In accordance with embodiments of the invention, a light emitting diode capable of emitting first light having a first peak wavelength is combined with a first phosphor layer overlying the light emitting diode, the first phosphor layer capable of absorbing the first light and emitting second light having a second peak wavelength and a second phosphor layer overlying the light emitting diode, the second phosphor layer capable of emitting third light having a third peak wavelength.

DETAILED DESCRIPTION

Figure 1:
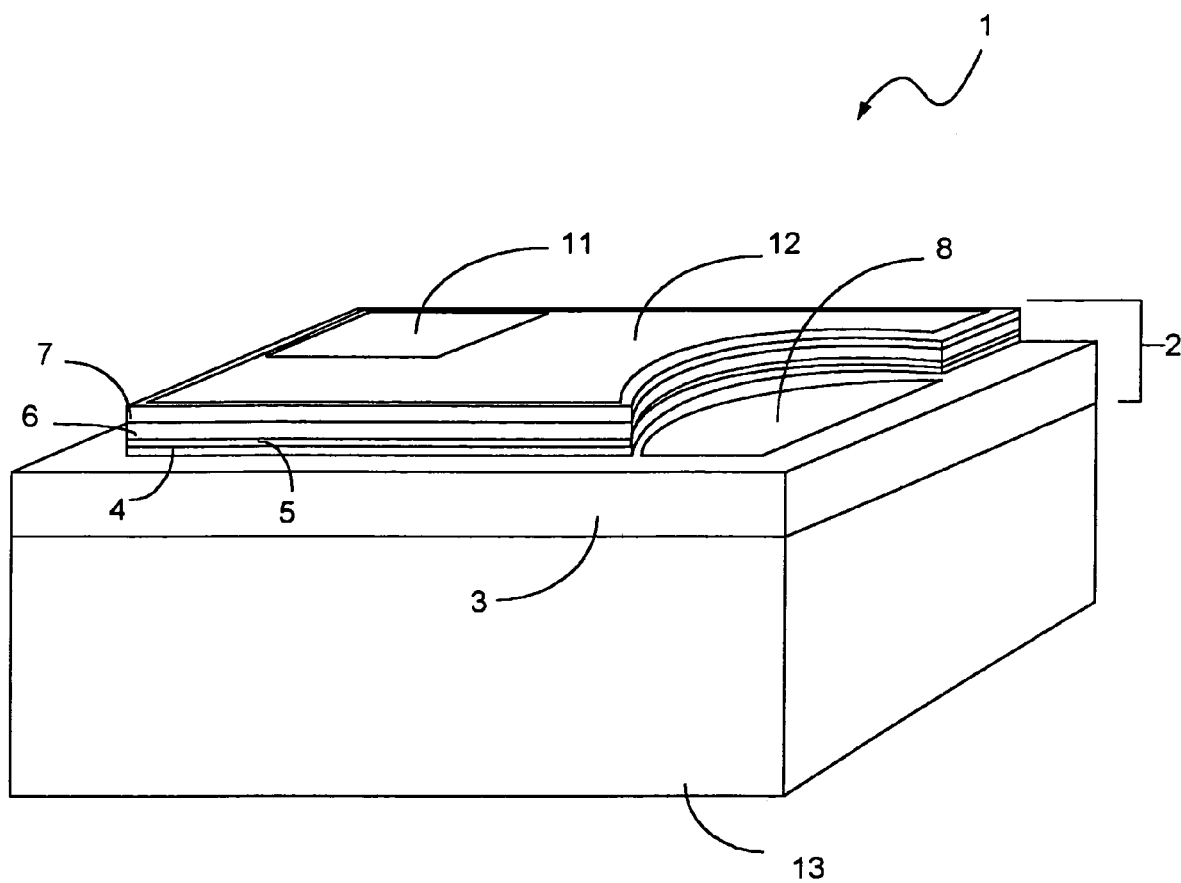
FIG. 1 is a perspective view of the light emitting diode device of the present invention before a phosphor thin film has been deposited thereon.

FIG. 1 is a perspective view of a light emitting diode (LED) 1 that is suitable for incorporating one or more phosphor thin films therein in accordance with the present invention. However, it should be noted that the LED of the present invention is not limited to any particular LED. Those skilled in the art will understand that a variety of known LEDs are suitable for use with the present invention.

For purposes of describing the typical components of the LED 1, the LED 1 has been shown without any phosphor thin films disposed thereon. The LED 1 may comprise, for example, a light emitting structure 2, which comprises two n-GaN layers 3 and 4, an SQW or MQW GaInN layer 5, a p-AlGaN layer 6 and a p-GaN layer 7. The light emitting structure 2 also comprises an n-electrode bond pad 8, an n-electrode 3, a p-electrode bond pad 11 and a p-electrode 12. The n-electrode 3 is comprised of GaN and the p-electrode 12 is either transmissive or reflective, as discussed below in more detail. The electrode bond pads 8 and 11, when connected to a power supply (not shown), provide the biasing current for causing the LED 1 to emit light.

The light emitting structure 2 is disposed on a substrate 13, which preferably is sapphire, although other materials may be used for the substrate 13. It should be noted that the materials used for creating the light emitting diode 1 are not limited to the materials discussed above with reference to FIG. 1. Those skilled in the art will understand that the light emitting diode 1 can be comprised of various types of materials. As stated above, the light emitting diode 1 is not limited to any particular type of light emitting diode, with the exception that the light emitting diode device utilized in accordance with the present invention emits a primary light that is either blue or ultraviolet, as discussed below in detail. Those skilled in the art will understand that various light emitting diodes are known that are suitable for this purpose.

The light emitting structure 2 that generates the blue or UV primary emission preferably is grown epitaxially on either a sapphire (i.e., $Al_2O_3$) or silicon carbide (i.e., SiC) substrate. Since both of these substrate materials are transparent to the primary radiation emission, the LED 1 can be mounted on a header (not shown) or in a reflector cup (not shown) in either a "normal" mounting configuration or a "flipchip" mounting configuration, which are known to those skilled in the art. As discussed below in detail, in some cases the substrate material may be transmissive, whereas in other cases it may be opaque. Those skilled in the art will understand that many substrate materials are suitable for these purposes.

Figure 2:
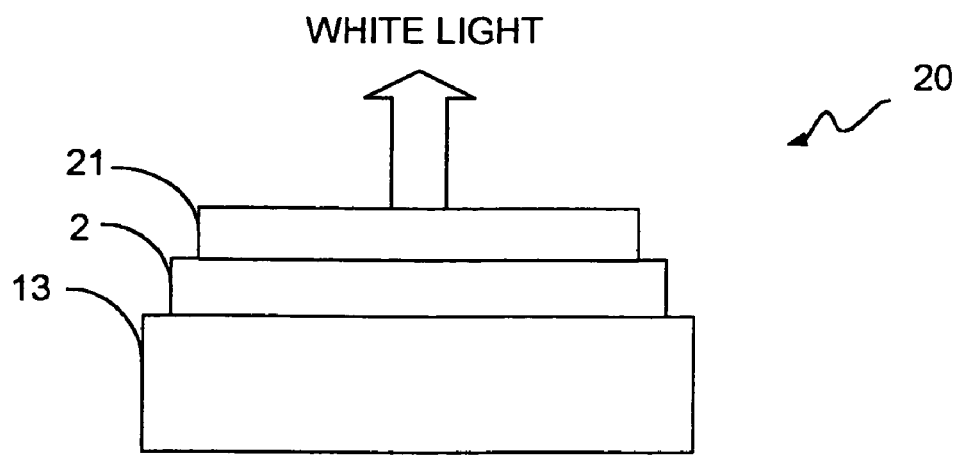
FIG. 2 is a side view of the light emitting diode device of the present invention in accordance with a first embodiment.

FIG. 2 is a side view of the LED device of the present invention in accordance with a first embodiment. The LED device 20 comprises a substrate 13 and an LED structure 2, as shown in FIG. 1. In accordance with this embodiment of the present invention, a single phosphor thin film 21 is disposed on the surface of the light emitting structure 2 opposite the surface of the light emitting structure 2 that is in contact with the substrate 13. The phosphor thin film 21 may be deposited on the light emitting structure 2 by a plurality of known methods. Phosphor thin films have been used primarily in the thin film electroluminescent display industry. Several known techniques may be used for depositing the phosphor thin film such as, for example, electron beam evaporation, thermal evaporation, rf-sputtering, chemical vapor deposition and atomic layer epitaxy.

The method that is utilized for depositing the thin film may depend on the desired characteristics of the thin film. For example, if the thin film is to absorb all of the primary radiation emitted by the LED, one particular deposition technique may be used, whereas if the thin film is to allow a percentage of the primary radiation to pass through it, a different technique may be used. Those skilled in the art will understand which type of technique is to be utilized in order to obtain a thin film having the desired characteristics.

Preferably, the method for depositing the thin film 21 shown in FIG. 2 is rf-sputtering. In accordance with this method, the phosphor powder is pressed into a target of a diameter slightly exceeding the LED wafer diameter such that a homogenous distribution of the phosphor film is ensured. As will be understood by those skilled in the art, the sputter gas characteristics can vary, but preferably the sputter gas mainly comprises Argon, but also comprises approximately 1% to approximately 3% of oxygen. The pressure and RF power input are matched to provide the thin film 21 with optimum thickness and homogeneity. The distance between the target and the substrate preferably is approximately 5 to 10 centimeters. The phosphor powder preferably is a Cerium-doped Yttrium-Aluminum-Garnet ($Y_3Al_5O_{12}$:$Ce^{3+}$), also denoted as YAG:Ce. Those skilled in the art will understand that the present invention is not limited to using any particular type of phosphor for the thin film. Those skilled in the art will understand that other types of phosphors exist that are suitable for this purpose.

Preferably, the phosphor thin film is deposited after the light emitting structure 2 has been grown on the substrate 13. However, this may not always be possible, due to the fact that the deposition conditions might be incompatible with the requirements for maintaining the integrity of the light emitting structure 2. Therefore, in some cases, it may be necessary to deposit the thin film before the light emitting structure is grown.

The homogeneity of the composition and the thickness of the thin film can be further improved by rotating the LED wafer on a particular trajectory, such as eccentric circles, or on more complicated trajectories, which are sometimes referred to as "planetary motion." This technique of rotating the wafer to improve the homogeneity of a material is known in the art. Since the manner in which phosphor thin films having a desired homogeneity can be created and deposited is known, no further discussion of the manner in which this is accomplished will be provided herein.

During operation, the light emitting structure 2 generates primary blue 30 radiation. The primary emission impinges on the thin film 21. A portion of the primary emission passes through the thin film 21 without exciting the dopants in the thin film. A portion of the primary emission impinging on the thin film 21 is absorbed by the dopants contained in the thin film and is converted into yellow light. This yellow light is emitted from the thin film 21 and combines with the portion of the unconverted primary radiation to form white light. The dopants are incorporated on an atomic scale into the phosphor thin film 21. When these dopants are excited by primary radiation, the dopants emit yellow light.

The total amount of dopants in the thin film is determined by their concentration and by the thickness of the thin film. The spatial distribution of the dopants in the thin film can be controlled with great precision. The techniques used for this purpose are common to thin film deposition processes used in the industry and are known to those skilled in the art. Those skilled in the art will understand the manner in which the amount of light-emitting dopants in the thin film and the spatial distribution of the dopants can be precisely controlled. By precisely controlling these characteristics of the thin film, the fraction of the primary radiation that will pass through the thin film without conversion is predictable and can be controlled. Therefore, the characteristics of the white light produced by the light emitting diode device 20 can be ensured. Thus, manufacturing uncertainties can be eliminated and LED devices having high quality and consistency can be obtained.

It should be noted that the primary light may comprise light having more than one wavelength. Similarly, the light emitted in response to excitation by the primary light may comprise light of more than one wavelength. For example, the blue light emitted by thin film 21 may correspond to a plurality of wavelengths making up a spectral band. Wavelengths this spectral band may then combine with the unconverted primary light to produce white light. Therefore, although individual wavelengths are discussed herein for purposes of explaining the concepts of the present invention, it will be understood that the excitation being discussed herein may result in a plurality of wavelengths, or a spectral band, being emitted. Wavelengths of the spectral bands may then combine to produce white light. Therefore, the term "spectral band" is intended to denote a band of at least one wavelength and of potentially many wavelengths, and the term "wavelength" is intended to denote the wavelength of the peak intensity of a spectral band.

Figure 3:
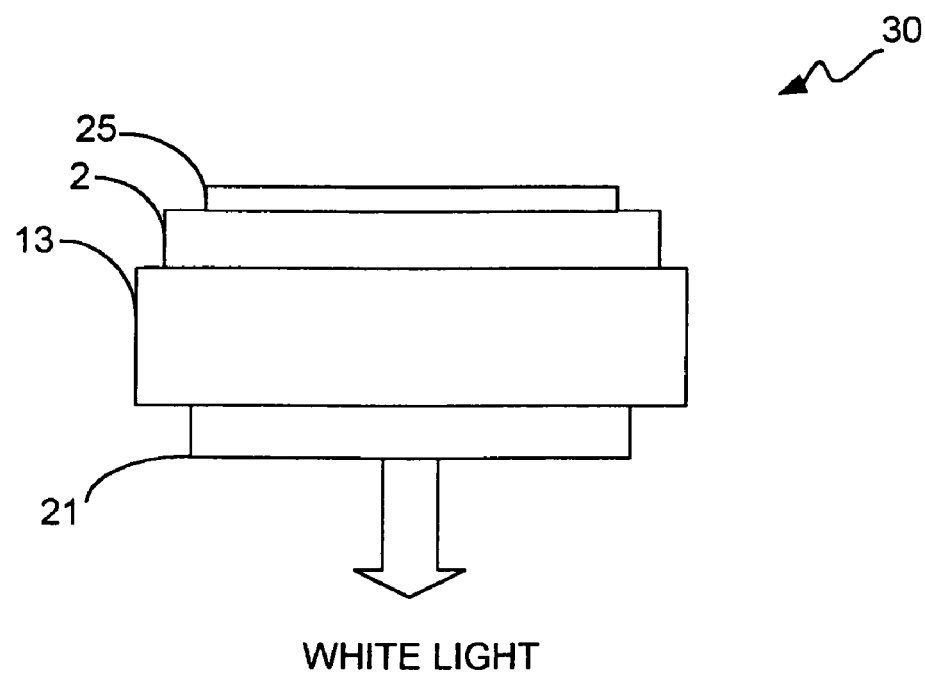
FIG. 3 is a side view of the light emitting diode device of the present invention in accordance with a second embodiment.

FIG. 3 is a side view of the light emitting diode device 30 of the present invention in accordance with an alternative embodiment. In accordance with this embodiment, a reflective electrode bond pad 25 is disposed on a surface of the light emitting structure 2 and the phosphor thin film 21 is disposed on a surface of the substrate 13 opposite the surface of the substrate 13 that is in contact with the light emitting structure 2. As stated above, the preferred substrate material is transparent. Therefore, the primary radiation emitted from the light emitting structure 2 that impinges on the reflective electrode bond pad 25 is reflected through the light emitting structure 2 and through the substrate 13 into the phosphor thin film 21. Once the primary radiation impinges on the phosphor thin film 21, the results are essentially identical to those discussed above with reference to the operations of the LED device 20 of FIG. 2. The phosphor thin film shown in FIG. 3 may be identical to the phosphor thin film shown in FIG. 2 and may also be created using the above-discussed rf-sputtering technique.

Since, in accordance with this embodiment, the phosphor thin film 21 is deposited directly onto the substrate 13, the phosphor thin film 21 may be deposited either before or after the light emitting structure 2 has been created and either before or after the reflective electrode bond pad 25 has been created.

Figure 4:
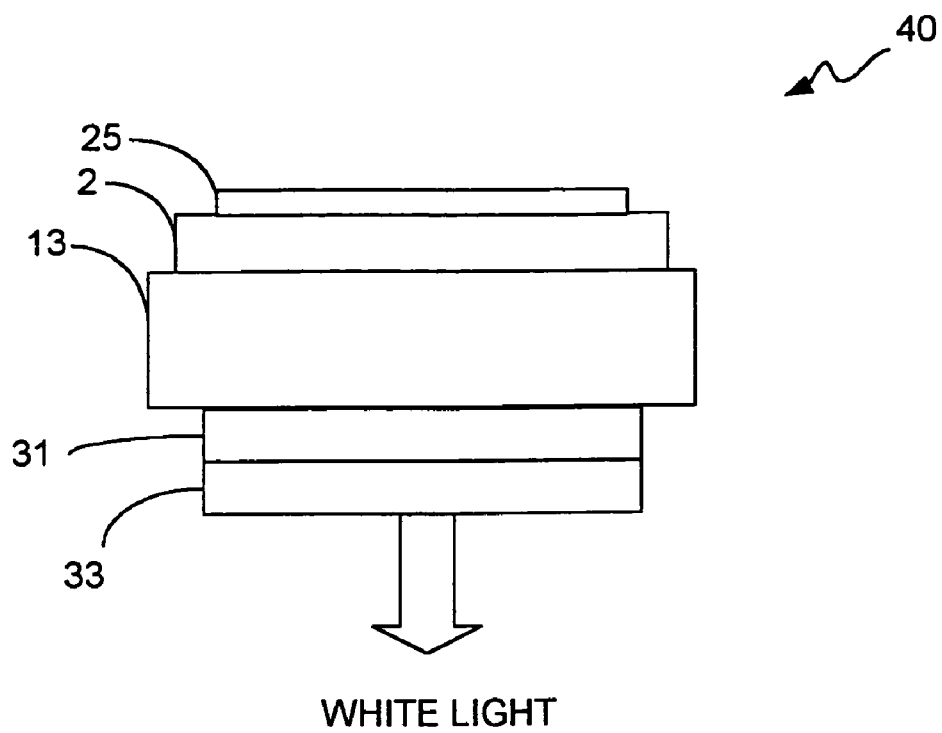
FIG. 4 is a side view of the light emitting diode device of the present invention in accordance with a third embodiment.

FIG. 4 is a side view of the light emitting diode device 40 of the present invention in accordance with an alternative embodiment in which the LED device 40 comprises at least two phosphor thin films 31 and 33. The thin films 31 and 33 are deposited on the side of the substrate 13 opposite the side of the substrate 13 on which the light emitting structure 2 is to be disposed. In accordance with this embodiment, the phosphor thin films 31 and 33 preferably are deposited using atomic layer epitaxy. Preferably the thin film 31 disposed on the substrate 13 produces red emissions in response to the blue or ultraviolet primary emissions impinging on the light-emitting dopants contained in the thin film 31. The phosphor thin film 33 disposed on phosphor thin film 31 emits green light in response to the blue or ultraviolet primary emissions impinging on the dopants contained in the thin film 33.

The red light emitted by thin film 31 is not absorbed by thin film 33. However, the green light emitted by thin film 33 is partly absorbed by thin film 31, and is converted into red light. Both of the thin film layers allow a portion of the primary blue light emitted by the light emitting structure 2 to pass through the thin films. This unconverted primary blue light combines with the red and green light emitted by thin film layers 31 and 33, respectively, to produce white light.

The thin film 33 that emits green light preferably is comprised of SrS:Ce and the thin film 31 that emits red light preferably is comprised of SrS:Eu. However, those skilled in the art will understand that the present invention is not limited with respect to the materials utilized for these thin films or with respect to the manner in which these thin films are deposited. The reflective electrode bond pad 25 reflects primary light generated by the light emitting structure 2 toward the thin films 31 and 33 and improves the efficiency of the LED device 40.

Alternatively, a thin film 31 totally absorbs all of the primary light and converts the primary light into blue light. Thin film 33 passes some of the blue light and converts some of the blue light into yellow light. The yellow light and the unconverted blue light combine to form white light, in the same manner described above with reference to FIGS. 2 and 3.

Figure 5:
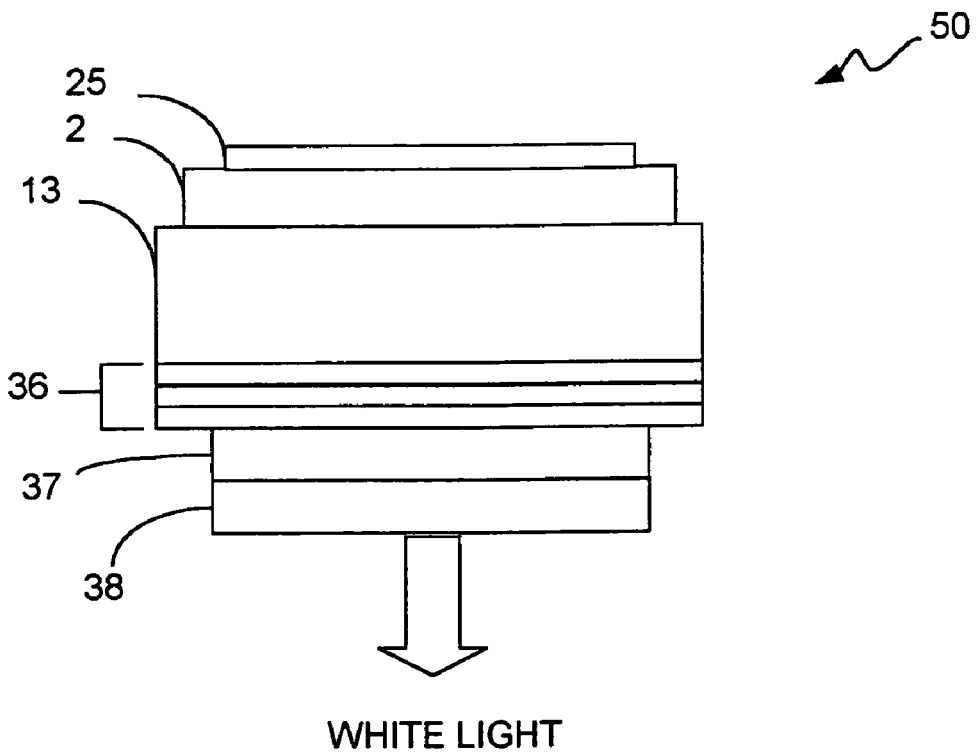
FIG. 5 is a side view of the light emitting diode device of the present invention in accordance with a fourth embodiment.

FIG. 5 is a side view of the light emitting diode device 50 of the present invention in accordance with another embodiment. This embodiment of the present invention also utilizes a plurality of phosphor thin films 37 and 38. However, in accordance with this embodiment, a dielectric mirror 36 is disposed between thin film 37 and the substrate 13. The dielectric mirror 36 is fully transparent to the primary emission of the light emitting structure 2 but is highly reflective at the wavelength of the emissions of the phosphor thin films 37 and 38. The phosphor thin films 37 and 38 may be identical to the phosphor thin films 31 and 33 shown in FIG. 4. Thus, the phosphor thin films 37 and 38 may produce red and green light, respectively, or blue and yellow light, respectively. Preferably, atomic layer epitaxy is used to deposit the thin films 37 and 38 in the manner discussed above with reference to FIG. 4.

Incorporating the dielectric mirror 36 into the LED device 50 increases the overall efficiency of the LED device 50 by isolating the light emitting structure 2 from luminescence light produced by the phosphor thin films 37 and 38, which might otherwise be re-absorbed by the light emitting structure 2. The thin films 37 and 38 of FIG. 5 operate in a manner that is essentially identical to the manner in which the thin films 31 and 33 of FIG. 4 operate to produce white light. The red and green light emitted by thin films 37 and 38, respectively, combines with the unconverted primary light emitted by the light emitting structure 2 to produce white light.

The phosphor thin film 37 preferably is deposited onto the dielectric mirror 36 and then the phosphor thin film 38 is deposited onto the phosphor thin film 37. It should be noted that the present invention is not limited with respect to the order in which the layers of the LED device 50 are incorporated into the LED device 50. For example, the phosphor thin films can be deposited after the dielectric mirror 36 has been fabricated on the substrate, but before the light emitting structure 2 and the reflective electrode 25 have been fabricated. Alternatively, the phosphor thin films 37 and 38 may be deposited after all of the other layers, including the dielectric mirror 36, the light emitting structure 2 and the reflective electrode 25, have been formed.

It will be understood by those skilled in the art that the present invention has been described with reference to particular embodiments, but that the present invention is not limited to these embodiments. Those skilled in the art will understand that various modifications may be made to the embodiments discussed above, which are within the scope of the present invention. As stated above, the present invention is not limited with respect to the materials used in the LED device, except that the LED device must be capable of generating primary emissions that are blue light or ultraviolet light. Those skilled in the art will also understand that, unless expressly stated herein, the present invention is not limited with respect to the order in which the layers or components of the LED device are formed. It will also be understood by those skilled in the art that the geometric arrangement or configuration of the phosphor thin films is not limited to any particular arrangement.

For example, rather than using overlapping phosphor thin films in the manner described above with reference to FIGS. 4 and 5, a plurality of phosphor thin film segments, each of which luminesces a different color of light in response to blue or ultraviolet primary radiation impinging thereon, may be deposited on a common surface, For example, three different phosphor thin films segments (not shown) could be deposited in a checker-board configuration on the dielectric minor 36 shown in FIG. 5. In this case, one of the thin film segments would luminesce red light, one would luminesce green light and one would luminesce or transmit blue light, depending on whether the primary light is UV or blue. The segments would be arranged to effect total absorption of the primary radiation emitted from the light emitting structure 2. The red, green and blue light generated by the respective phosphor thin films would then combine to create white light. Those skilled in the art will understand how various other configurations of thin film layers and segments could be incorporated into an LED device to produce an LED device that generates white light.

Furthermore, it should be noted that it is not required that white light be produced by the LED device of the present invention. Those skilled in the art will understand the manner in which a phosphor thin film can be produced and utilized in accordance with the principles of the present invention to obtain an LED device that produces other colors of light. For example, those skilled in the art will understand, in view of the description provided herein, how a phosphor thin film may be obtained that produces green light by totally absorbing the blue or UV primary emission.

What is being claimed is:

1. A device comprising:
    a light emitting diode capable of emitting first light having a first peak wavelength;
    a first phosphor layer overlying the light emitting diode, the first phosphor layer capable of absorbing the first light and emitting second light having a second peak wavelength; and
    a second phosphor layer overlying the light emitting diode, the second phosphor layer capable of emitting third light having a third peak wavelength;
    wherein one of the first phosphor layer and the second phosphor layer is in direct contact with a surface of the light emitting diode.

2. The device of claim 1 wherein the first phosphor layer and the second phosphor layer are thin films comprising dopants spatially distributed in an optically homogenous manner.

3. The device of claim 1 wherein the first phosphor layer and the second phosphor layer are separate layers.

4. The device of claim 1 wherein:
    the second peak wavelength is longer than the first peak wavelength; and
    the third peak wavelength is longer than the second peak wavelength.

5. The device of claim 4 wherein:
    the first peak wavelength is blue;
    the second peak wavelength is green; and
    the third peak wavelength is red.

6. The device of claim 4 further comprising a third phosphor layer overlying the light emitting diode, capable of emitting fourth light having a fourth peak wavelength.

7. The device of claim 6 wherein:
    the first peak wavelength is UV;
    the second peak wavelength is blue;
    the third peak wavelength is green; and
    the fourth peak wavelength is red.

8. The device of claim 6 wherein the first, second, and third phosphor layers form a checkerboard pattern.

9. The device of claim 4 wherein the second phosphor layer is adjacent to the light emitting diode and the first phosphor layer overlies the second phosphor layer.

10. The device of claim 4 wherein each of the first and second phosphor layers is adjacent to the light emitting diode and the first and second phosphor layer form a checkerboard pattern.

11. The device of claim 1 wherein the light emitting diode comprises:
    a substrate having a first surface and a second surface opposite the first surface; and
    a stack of semiconductor layers adjacent the first surface;
    wherein the surface of the light emitting diode in direct contact with one of the first phosphor layer and the second phosphor layer is the second surface of the substrate.

12. The device of claim 1 wherein the first and second phosphor layers are formed such that a portion of the first light is unconverted by the first and second phosphor layers.

13. The device of claim 12 wherein a combination of the first, second, and third light appears white.

14. The device of claim 1 further comprising a dielectric mirror disposed between the light emitting diode and the first phosphor layer.

15. The device of claim 14 wherein the dielectric mirror transmits the first light and reflects the second and third light.

* * * * *